United States Patent [19]

Kia et al.

[11] 4,310,870

[45] Jan. 12, 1982

[54] CHASSIS CAPTIVATION ARRANGEMENT FOR AN ELECTRONIC DEVICE

[75] Inventors: Mansor Kia, Lombard; Harold G. Hanley, Arlington Heights, both of Ill.

[73] Assignee: Motorola, Inc., Schaumburg, Ill.

[21] Appl. No.: 108,864

[22] Filed: Dec. 31, 1979

[51] Int. Cl.³ .............................................. H05K 7/16
[52] U.S. Cl. .................................. 361/415; 361/391; 361/394; 361/399
[58] Field of Search ............... 361/390, 391, 394, 399, 361/415

[56] References Cited

U.S. PATENT DOCUMENTS

| | | | |
|---|---|---|---|
| 2,855,454 | 10/1958 | Alden | 361/391 |
| 3,547,274 | 12/1970 | Sosinski | 361/394 X |
| 3,851,222 | 11/1974 | Michalak | 317/101 R |
| 3,885,127 | 5/1975 | Walter et al. | 219/373 |
| 4,038,696 | 7/1977 | Etchison | 361/415 |
| 4,048,669 | 9/1977 | Bowler | 361/415 X |
| 4,063,788 | 12/1977 | Laatasiewicz | 361/395 X |
| 4,092,698 | 5/1978 | Brefka | 361/399 |
| 4,101,864 | 7/1978 | Benthuysen | 338/183 |
| 4,159,506 | 6/1979 | Latasiewicz | 361/399 |

FOREIGN PATENT DOCUMENTS 2613384 10/1977 Fed. Rep. of Germany ...... 361/399

*Primary Examiner*—Richard R. Kucia
*Attorney, Agent, or Firm*—Joseph T. Downey; James W. Gillman

[57] ABSTRACT

A chassis assembly captivation arrangement for an electronic apparatus is disclosed. Circuit boards are attached to a chassis bracket formed from a strip and having three linear segments preferably comprising a U-shape. The chassis bracket includes vertical support tabs and outwardly extending flanges. The flanges slideably interconnect with entrapment members in a lower housing portion and the support tabs contact both lower and upper housing portions when they are joined to enclose the chassis assembly. With this arrangement the chassis and circuit boards are captivated transversely and vertically within the joined housing portions.

12 Claims, 7 Drawing Figures

U.S. Patent     Jan. 12, 1982     Sheet 3 of 4     4,310,870
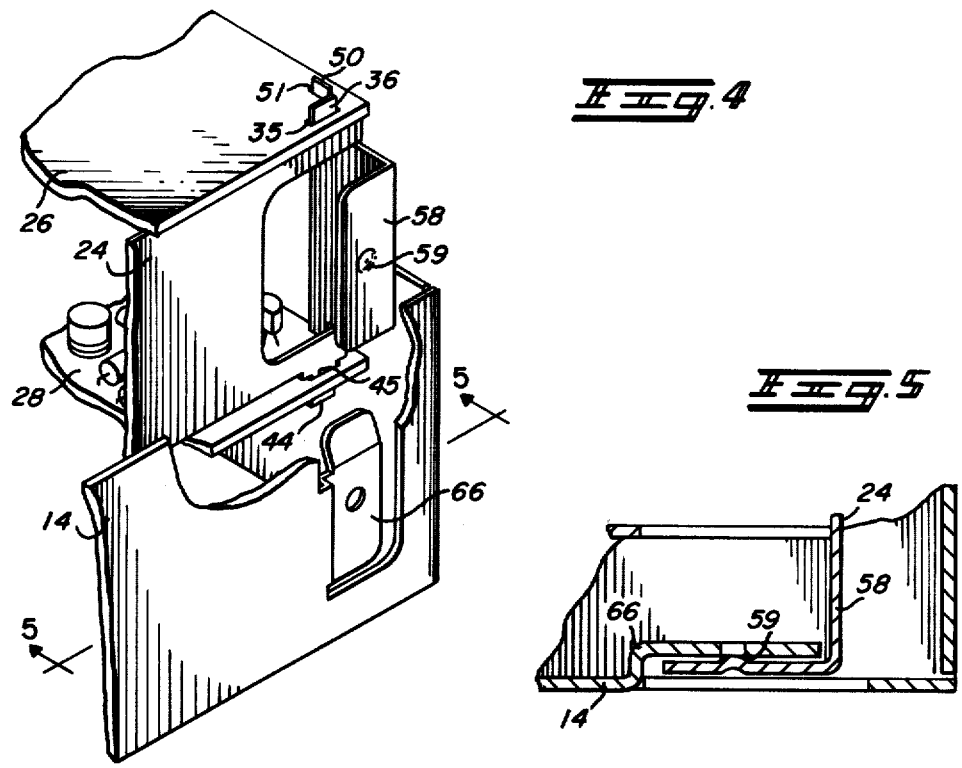
Fig. 4
Fig. 5
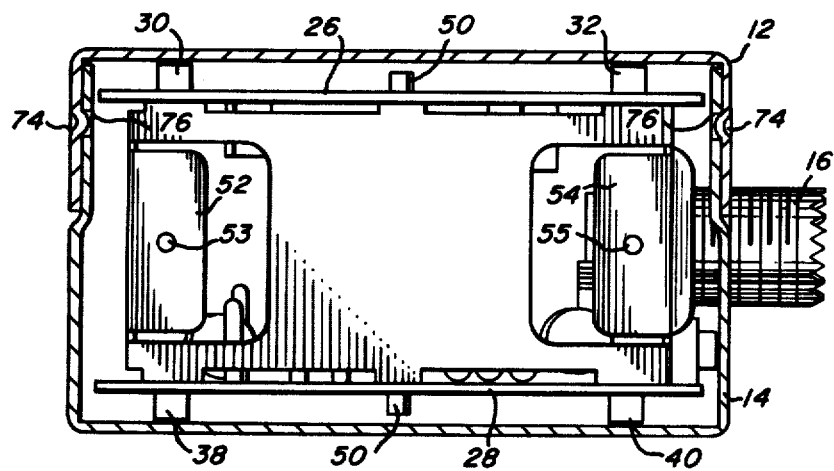
Fig. 6

CHASSIS CAPTIVATION ARRANGEMENT FOR AN ELECTRONIC DEVICE

BACKGROUND OF THE INVENTION

1. Field of the Invention

This invention relates to the general field of chassis mounting for an electronic apparatus and particularly to a chassis captivation arrangement for an optimally compact circuit design in which the chassis is captivated by interlocking housing portions.

2. Description of the Prior Art

Many chassis mounting assemblies providing enclosures for printed circuit board circuits are well known in the art. In some, chassis mounted printed circuit boards are attached to a rigid frame and a protective housing is attached to the chassis. Others include mechanical stiffeners for large circuit boards, handle arrangements on a chassis for easier insertion and removal of the board and, a suspended circuit board assembly to attenuate the vibration transmitted to the electrical components. While these known assemblies have some advantages, none facilitate mounting a circuit in which the board and chassis arrangement have bee compacted to occupy an optimally small total volume. A reduced volume requirement is especially significant in electronic apparatus for use in vehicles where the continuing reduction of available space for modern vehicles has forced package size reductions in the circuitry. But, at the same time continuing cost containment necessitates utilization of the same electronic design with the same type and number of components. Thus, the problem is not one of miniaturization by use of custom integrated circuits but rather one of captivating closely packed discrete components in a reduced total volume.

SUMMARY OF THE INVENTION

It is an object of the invention to provide an improved mounting arrangement for a compact chassis and printed circuit board assembly.

It is another object of this invention to provide an improved compact chassis and printed circuit board mounting arrangement in which the chassis and printed circuit board assembly are securely captivated within a removably interlocking protective housing.

A chassis captivation arrangement for an electronic apparatus comprises, in combination, a U-shaped bracket having means for attaching, in a parallel configuration, a pair of printed circuit boards. The bracket is formed from a planar strip and has a configuration when viewed from the strip edge comprising three linear segments. The bracket had flange means positioned at nonadjacent linear segments of the bracket and upper and lower tab means positioned adjacent the flange means with the tab means extending to a length substantially greater than the thickness of a printed circuit board. First and second separable housing portions with the first housing portion including integrally formed members slideably interfitting with the flange means to captivate transversely the chassis within the first housing portion. The lower tab means also contact the first housing portion to provide vertical support for the chassis, and the second housing portion interlocks with the first housing portion and is adapted to contact the upper tab means and to captivate the chassis arrangement vertically between the first and second housing portions when joined, whereby the chassis arrangement is enclosed and captivated transversely and vertically within the joined interlocking housing portions.

BRIEF DESCRIPTION OF THE DRAWINGS

FIG. 4 is a partial perspective view showing the chassis and circuit board arrangement positioned relative to the bottom housing portion prior to final assembly.

FIG. 5 shows a sectional view of a portion of FIG. 4 after final assembly.

FIG. 6 is a sectional view of an assembled apparatus showing the vertical containment within the joined housing portions.

DETAILED DESCRIPTION OF THE PREFERRED EMBODIMENT

Figure 1:
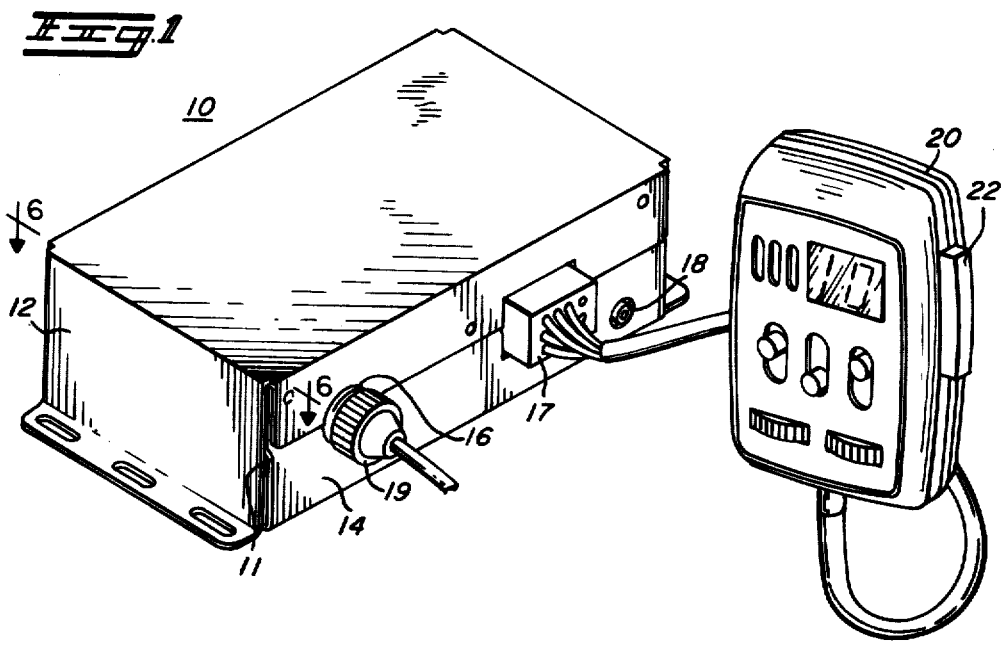
FIG. 1 is a perspective view of an electronic apparatus in which the invention could be utilized.

Referring now more particularly to the drawings, FIG. 1 shows an example of an electronic apparatus 10, embodying the invention. Housing assembly 11 comprises an upper housing portion 12 interconnected with a lower housing portion 14. Also shown attached to enclosed housing assembly 11 are electrical access terminals 16, 17 and 18. Electrical access terminal 16 is preferably for an external antenna connection and terminal 18 is preferably a speaker connection. An antenna connector 19 is shown coupled to terminal 16. Coupled to electrical access terminal 17 by means of a 24 pin disconnectable coupler is a hand-held control unit 20 for interrogating and controlling the electronic apparatus. The 24 pin connector may also serve to supply power to the apparatus. Control unit 20 may include various switches and dials to control the operation of electronic apparatus 10 and provide a visual display for reading out information from the electronic apparatus. In the preferred embodiment, electronic apparatus 10 is a remotely controllable citizens band transceiver which has a hand-held control module 20 which includes a microphone adapted for controlling various functions including squelch and volume and activating various other electronic functions related to the operation of the transceiver. A push-to-talk switch 22 shown as part of hand-held device to enable an operator to activate the transmitter portion to transmit on a selected CB channel. The controls for remotely controlling a CB transceiver are well known to those in the art and may include apparatus to control signal level, broadcast range, electronic tuning, etc. but do not comprise part of the invention.

Figure 2:
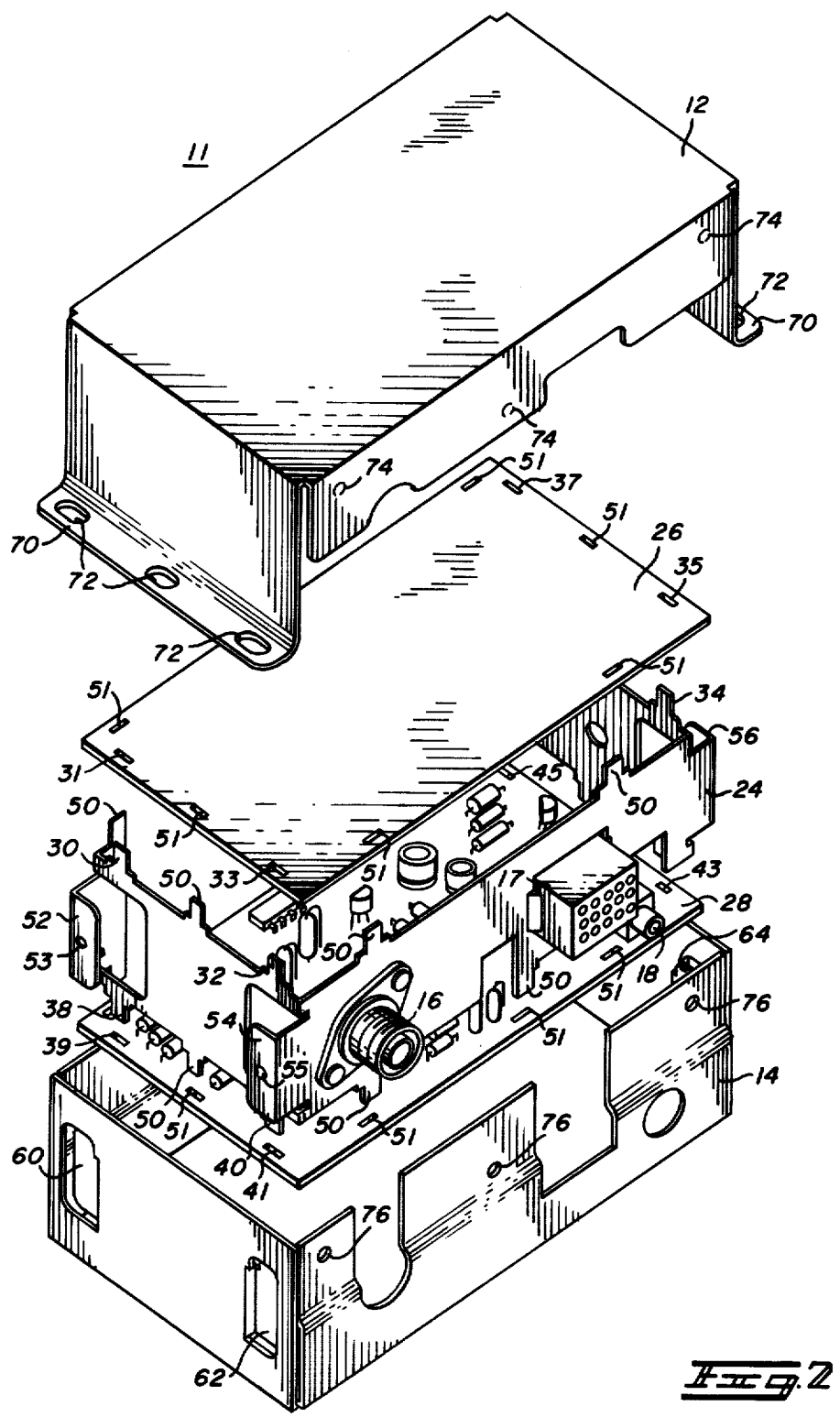
FIG. 2 is an exploded perspective view of a portion of the apparatus of FIG. 1.

FIG. 2 shows housing portion 11 in an exploded view with upper housing portion 12 removed from lower housing portion 14. A chassis bracket 24 is shown interposed between the upper and lower housing portions and adjacent to circuit boards 26 and 28. Circuit boards 26 and 28 are arranged with their component sides adjacent. As may be better seen in this figure, electrical access terminals 16 and 17 are mounted directly to chassis bracket 24 while terminal 18 is mounted on circuit board 28. Corresponding openings are provided in upper housing portion 12 and lower housing 14 to permit access from outside of the housing.

Chassis bracket 24 comprises a strip bent into a configuration containing three linear segments when viewed from the strip edge. A plurality of tabs extend vertically in both directions along the planes passing through the linear segments. In the preferred embodiment chassis bracket 24 a is substantially U-shaped strip with a plurality of tabs extending vertically in both upward and downward directions in the planes of the strip. While the U-shape is preferred, it is clear that any bracket having at least three linear segments in contact with a circuit board could provide a suitable chassis bracket. Preferably the U-shaped chassis bracket 24 is made of metal.

All of the vertically extending tabs are not of the same length or width. The four vertical support tabs at the relative upper corner positions as shown in the figure and designated as 30, 32, 34 and 36, with tab 36 not shown since the upper circuit board 26 covers that position in the perspective view, are in alignment with slots 31, 33, 35 and 37 respectively, located at the four corners of circuit board 26. Similarly, in the downward direction a corresponding set of lower vertical support tabs 38, 40, 42 and 44 are located at the lower four corners of chassis bracket 24, although tabs 42 and 44 are not shown in this perspective view. Lower vertical support tabs 38, 40, 42, and 44 are in alignment with slots 39, 41, 43 and 45 respectively, located at the four corners of circuit board 28. All of the vertical support tabs 30, 32, 34, 36, 38, 40, 42 and 44 extend a distance which is larger than the remaining vertical tabs 50 and are substantially greater in length than the thickness of either circuit board. The vertical support tabs in the preferred embodiment are approximately 0.220 inches in length while the normal circuit board thickness is approximately 0.060 inches.

All other vertical tabs 50 are substantially shorter and may be of generally smaller dimensions than the support tabs. Vertical tabs 50 range in length from 0.090 to 0.170 inches. Vertical tabs 50 are used for the purpose of attaching the circuit boards to chassis bracket 24. Each vertical tab 50 is in alignment with a slot 51 located in either circuit board 26 or 28. The method of circuit board attachment is well known to those skilled in the art and may consist of soldering the tabs 50 at a circuit board position or merely twisting or otherwise distorting the attachment tabs 50 to lock the board mechanically to the chassis bracket. This point of mechanical contact can also be soldered to a ground pad on the circuit side of printed circuit board to enable chassis bracket 24 to provide a ground plane surrounding the components mounted on the board. Such an electrical interconnection would allow the chassis bracket to provide an electrical shield on three sides of the circuit board components.

Chassis bracket 24 also includes four outwardly extending L-shaped flanges, pairs of which are located on opposite linear segments of the preferred U-shape. In particular, flanges 52, 54, 56 and 58 are positioned at the respective corners of chassis bracket 24 with flange 58 not shown in this perspective view because of the position of circiut board 26. Each of flanges 52, 54, 56 and 58 may be formed by shearing and forming a region of the metal strip of chassis bracket 24 and include inward protuberances 53, 55, 57 and 59, respectively, on the transverse segment of the L-shape as will be described in later figures. As may be seen from FIG. 2 flange means 52, 54, 56 and 58 are positioned in vertical alignment with four corresponding entrapment members 60, 62, 64 and 66 which are preferably an integral part of lower housing portion 14. Specifically, lower housing portion member 60 is in alignment with chassis bracket flange 52. Similarly lower housing portion 14 contains integrally formed members 62, 64 and 66 located in alignment with flanges 54, 56 and 58 respectively, with member 66 not being shown because of the relative position of circuit board 28. As will be explained in further detail in later figures, chassis flanges 52, 54, 56 and 58 slideably interconnect with lower housing entrapment members 60 62, 64 and 66 respectively to provide transverse captivation of the chassis and circuit board arrangement within lower housing portion 14.

Upper housing portion 12 in shown to contain assembly mounting flanges 70 on each end. The assembly mounting flanges 70 further contain a number of slotted holes 72 which allow for the secure attachment of the assembled electronic device. Moreover, upper housing portion 12 is shown to have a series of inwardly extending bosses or protuberances 74 which interfit with a corresponding arrangement of holes designated 76 in lower housing portion 14. While not all of the tabs, support tabs, flanges, bosses and corresponding holes are shown in this perspective view, from the symmetry of the device and from the later figures it will be clear where such elements are to be located.

Figure 3:
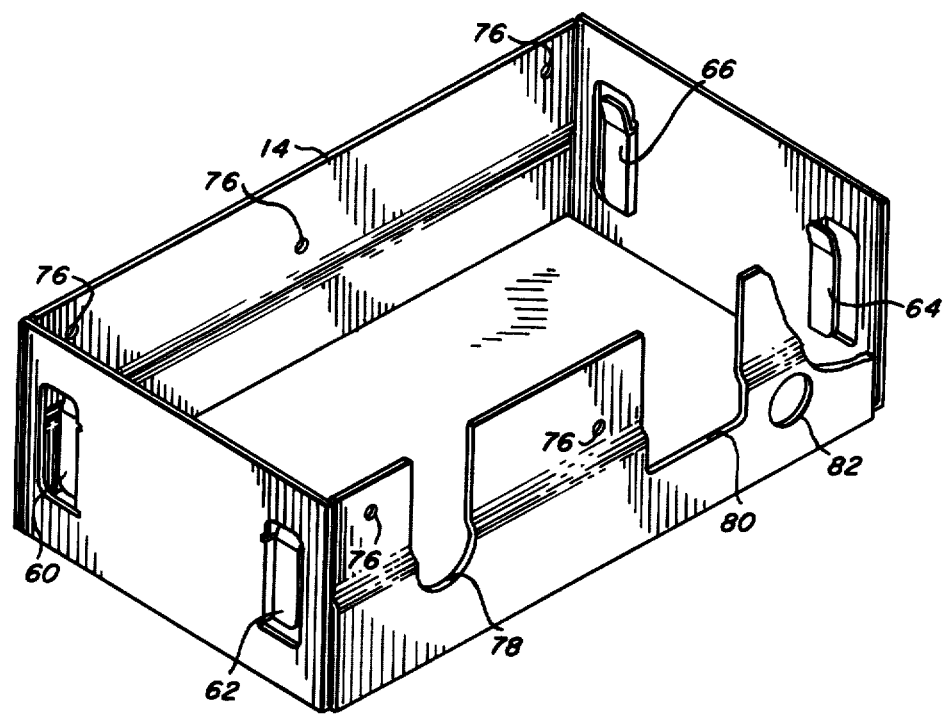
FIG. 3 is a perspective view of the lower housing portion partially cut away to show additional detail.

FIG. 3 shows bottom housing portion 14 in perspective with a portion of the corner cut away to more clearly show the entrapment members 60, 62, 64 and 66 which provide transverse captivation of the chassis and circuit board arrangement within the lower housing portion. Lower housing portion 14 is in the form of a substantially rectangular parallelepiped which includes five surfaces. The top portion is left open to allow for insertion of the circuit board and chassis bracket assembly into lower housing portion 14. Each of the end walls of lower housing portion 14 contains entrapment members which interfit with the outwardly extending flanges 52, 54, 56 and 58 of chassis bracket 24. In particular, when chassis bracket 24 is properly aligned, the L-shaped chassis flanges slideably interfit with lower housing entrapment members 60, 62, 64 and 66. Each of the entrapment members has an L-shaped form and includes a slightly inwardly bent upper portion to facilitate access.

As may be more clearly seen in this view, lower housing portion 14 contains a plurality of holes 76 which are designed to be in alignment with a corresponding plurality of bosses or protuberances 74 located on upper housing portion 12. This combination of elements enables removable interlocking of the joined housing sections. A vertical wall of the lower housing portion 14 is shown to have a series of cut outs designated 78, 80 and 82 which provide passageways for electrical access terminals 16, 17 and 18. The lower housing portion 14 in the preferred embodiment is most conveniently formed of a thin gauge metal which may be painted or otherwise coated to provide a suitably durable yet attractive outer surface while still providing both stable support for the chassis and printed circuit board arrangement and a surrounding conductive shield.

FIG. 4 is a partial perspective view, prior to assembly of the chassis into the lower housing portion 14, having a portion cut away to show the alignment for the slideable interconnection between outwardly extending chassis flange 58 and entrapment member 66 of lower housing portion 14. Although previously enumerated, this flange and corresponding entrapment member were not shown in the perspective view of FIG. 2. A single board attachment tab 50 is shown extending through the corresponding slotted hole 51 in circuit board 26 and normally this tab would be twisted to provide mechanical attachment between the circuit board and the chassis bracket. Also shown extending through the slot 35 in circuit board 26 is upward vertical support tab 36. Vertical support tab 36 (approximately 0.220 inches) extends a distance greater than the thickness (approximately 0.060 inches) of the circuit board to provide vertical support. The support function of the upper and lower vertical support tabs will be shown in more detail in later figures but these tabs function much like legs to provide both spacing and support for the chassis assembly. A portion of lower circuit board 28 is also shown attached to chassis captivation bracket 24. Vertically extending support tab 44 extends through the thickness of board 28 to provide vertical support for the chassis and circuit board assembly. The assembled combination of circuit boards held together in a parallel configuration will be transversely captivated within lower housing portion 14 by the slideable mechanical arrangement between the outwardly extending flanges of chassis bracket 24 and the corresponding entrapment members of lower housing portion 14. In particular flange 58 slideably interconnects with the integrally formed captivation member 66 to provide transverse captivation of the circuit board and chassis arrangement.

FIG. 5 is a sectional view of a portion of FIG. 4 after assembly of the chassis into the lower housing portion 14 to show the interaction of the protuberances located on the outwardly extending flanges of chassis bracket 24 and the entrapment members. In particular part of the vertical wall of lower housing portion 14 is shown along with an integrally formed L-shaped entrapment member 66. Chassis bracket 24 is shown with outwardly extending flange 58 in slideable contact with entrapment member 66. The function of inwardly extending protuberance 59 is to contact member 66 to form a slideable but tight and secure contact between flange 58 and member 66. The strip thickness for chassis bracket 24 is approximately 0.030 inches while the inwardly directed protuberance 59 extend from 0.005 to 0.010 inches. Thus a secure interference fit for each flange and entrapment member pair establishes transverse captivation.

FIG. 6 is a cross sectional view of FIG. 1 showing a portion of the assembled circuit board and chassis arrangement captivated within the joined housing portions 12 and 14. In particular, upper housing portion 12 is shown interlocked with lower housing portion 14 to provide containment of the entire circuit board and chassis arrangement. As previously described, the flanges of chassis bracket 24 in conjunction with the entrapment members of lower housing portion 14 provide transverse captivation of the chassis and circuit board arrangement. The joined housing portions 12 and 14 in conjunction with the vertically extending support tabs provide for captivating the chassis and circuit board arrangement in a vertical direction.

As may be seen from FIG. 6, upper vertical support tabs 30 and 32 contact upper housing portion 12 and prevent any movement of the chassis and circuit board arrangement in that direction. Moreover, lower vertical support tabs 38 and 40 provide support by contact with lower housing portion 14 and prevent any movement of the chassis and circuit board arrangement in that direction. The dimension of the housing portions and of the lengths of the vertically extending support tabs are such that when upper and lower housing portions 12 and 14 are joined the circuit board arrangement is trapped between them.

Although not shown in this cross sectional view, it should be apparent that corresponding upper vertical support tabs 34 and 36 contact housing portion 12 at the opposite end of the circuit board and chassis arrangement and corresponding lower vertical support tabs 42 and 44 provide support from lower housing portion 14 at the opposite end shown in FIG. 6. As has been said earlier, the chassis arrangement is symmetrical and therefore should be sufficient to show only one end sectional view. Tabs 50 extend through the printed circuit boards 26 and 28 and are shown twisted but do not contact either the upper or lower housing portions since they merely provide attachment between a circuit board and the chassis bracket. On both the left and right hand sides of the vertical walls, bosses or protuberances 74 are shown in contact with holes 76 to provide a removably interlocking of upper housing portion 12 with lower housing portion 14.

Figure 7:
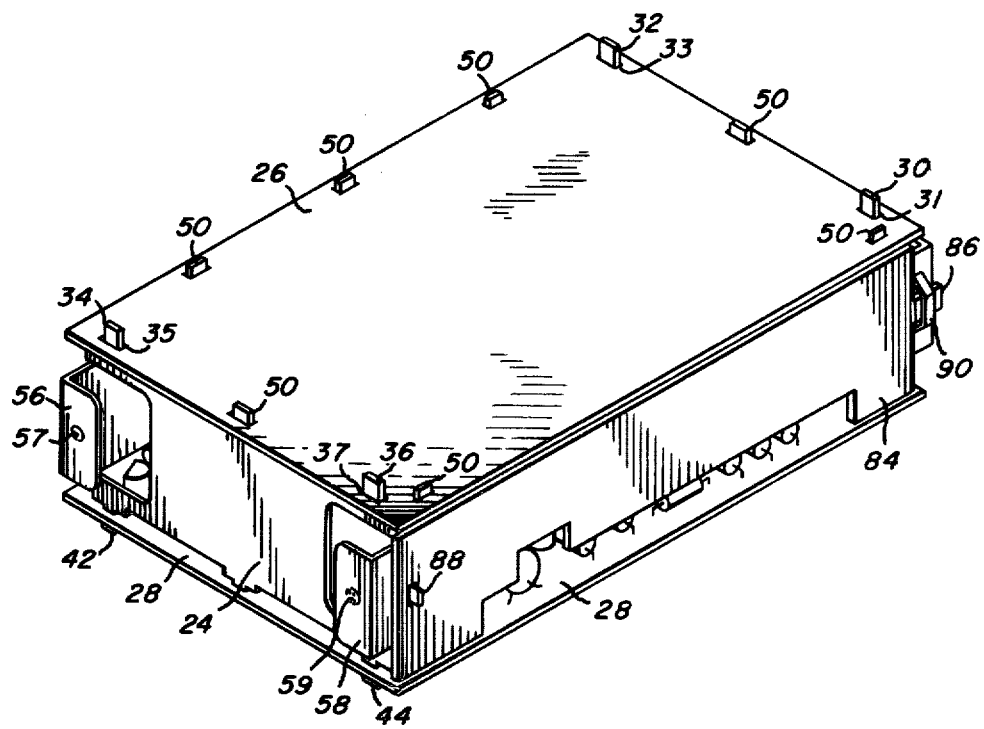
FIG. 7 shows an alternative embodiment, similar to the circuit board and chassis arrangement shown in FIG. 2, but with the addition of a third circuit board.

FIG. 7 is a perspective view of an alternative embodiment showing the printed circuit boards 26 and 28 attached to chassis bracket 24. This view more clearly shows that portion of the assembly previously covered by the locations of the various elements in the perspective view of FIG. 2. A third circuit board 84 substantially rectangular in shape includes a projecting tab 86 at one end. Circuit board 84 is attached at one end to chassis bracket 24 by board attachment tab 88 which is quite similar to any of attachment tabs 50. At the other end of circuit board 84, the projecting tab portion 86 extends through and is supported by a formed member 90. Attachment tab 88 and projecting tab 86 in conjunction with formed member 90 provide a secure attachment of the third circuit board to the chassis bracket 24. The location of a third circuit board 84 relative to chassis bracket 24 is preferably along the open portion of the U-shaped bracket, but its position would be dictated by the shape of chassis bracket 24. The third circuit board 84 is in a plane substantially perpendicular to the parallel arrangement of circuit boards 26 and 28. It is clear to those skilled in the art that there must be a minor modification to the ends of substantially U-shaped bracket 24 to provide for circuit board attachment tab 86 and formed member 90. It is known to those skilled in the art to provide the necessary mounting tabs and forms for circuit board attachment. Similarly outwardly extending flanges 52, 54, 56 and 58 of chassis bracket 24 are positioned to allow for clearance within the joined housing portions of the apparatus so that the outward or solder side of circuit board 84 will not contact either portion of the housing.

In FIG. 7, the component side of the circuit board 84 in the preferred embodiment, is arranged so that it is adjacent to the space occupied by the component portions of the parallel arrangement of circuit boards 26 and 28. The arrangement of the three boards in this manner provides for a substantial electrical shield to the components by positioning the solder side of all of the boards outwardly and their component sides inwardly. While not specifically shown for any electrical connections, it is clear that chassis bracket 24 may provide a grounding plane for the electrical shielding of the components mounted on the several printed circuit boards. As is customary with such chassis arrangements, the choice of metal for the material from which the bracket 24 is constructed can provide for both electrical shielding and operate as a heat sink to allow dissipation of component heat to the electronic device as a whole. Thus the function of the captivation arrangement as embodied in the assembly of the chassis bracket, the circuit boards and the joined housing portions is such that it provides a secure captivation of the chassis and circuit board arrangement, electrical shielding thereof and heat dissipation for the components mounted thereon. It may also be seen that the lower portion of the housing provides transverse captivation of the chassis bracket and circuit board arrangement. When the upper portion of the circuit housing is interconnected with the lower portion, vertical captivation of the chassis bracket and circuit board arrangement is achieved. It may also be observed that the joined housing portions provide access to the captivated and enclosed electronic circuit arrangement.

While a specific embodiment of this invention has been shown and described, further modifications and improvements will occur to those skilled in the art. All modifications which retain the basic underlying principles disclosed and claimed herein are within the scope of this invention.

We claim:

1. A chassis captivation arrangement for an electronic apparatus comprising in combination:
    a chassis bracket having means for attaching in parallel a pair of printed circuit boards, said bracket formed from a planar strip and having a configuration when viewed from the strip edge comprising three linear segments;
    said bracket having flange means positioned at two nonadjacent linear segments thereof and said bracket having upper and lower support tab means positioned adjacent said flange means, said support tab means extending a length substantially greater than the thickness of a printed circuit board;
    first and second separable housing portions, said first housing portion including integrally formed entrapment members slidably interfitting with said flange means to captivate transversely said chassis within said first housing portion, said lower support tab means also contacting said first housing portion to provide vertical support for said chassis;
    said second housing portion interlocking with said first housing portion and being adapted to contact said upper support tab means to captivate said chassis arrangement vertically between said first and second housing portions when joined,
    whereby said chassis arrangement is enclosed and captivated transversely and vertically within said joined interlocking housing portions.

2. The chassis captivation arrangement of claim 1 wherein said chassis bracket when viewed from the strip edge has a substantially U-shaped configuration and said flange means comprise pairs of outwardly extending flanges positioned on the two nonadjacent linear segments of said U-shape.

3. The chassis captivation arrangement of claim 2 wherein said flange means are laterally extending and said upper and lower support tab means are vertically extending from said U-shaped bracket.

4. The chassis captivation arrangement of claim 3 wherein said outwardly extending flanges are formed from said planar strip in an L-shape when viewed from the strip edge and, said entrapment members are correspondingly L-shaped to enabled interfitting with said flanges and positioned adjacent the corners of said lower housing portion.

5. The chassis captivation arrangement of claim 4 wherein at least one of said housing portions contains apertures to allow electrical access to said electronic apparatus.

6. The chassis captivation arrangement of claim 5 further including a pair of printed circuit boards attached by said bracket attachment means to said U-shaped bracket in a parallel arrangement and configured with the component sides adjacent.

7. The chassis captivation arrangement of claim 6 wherein said one of housing portions further includes means for securely mounting said joined housing portions at a desired location.

8. The chassis captivation arrangement of claim 7 wherein said first and second housing portions contain corresponding bosses and indentations which interfit to enable removable interlocking of said housing portions.

9. The chassis captivation arrangement of claim 8 wherein said bracket means further includes attachment means at the end of said nonadjacent linear segments of said U-shape for mounting a third printed circuit board, said third circuit board being configured in a plane perpendicular to said parallel arrangement of said pair of printed circuit boards across the open segment of said U-shape.

10. The chassis captivation arrangement of claim 9 further including a third circuit board mounted on said chassis bracket such that the component side of said third circuit board is adjacent the component sides of said parallel arrangement of printed circuit boards.

11. A chassis captivation arrangement for an electronic apparatus comprising in combination:
    a substantially U-shaped bracket;
    a pair of printed circuit boards attached to said bracket in a parallel arrangement with the component sides of said circuit boards being adjacent;
    said bracket having laterally projecting flange means positioned at opposite segments of said U-shape and having upper and lower tab means positioned adjacent said flange means, said tab means extending beyond the thickness of said printed circuit boards;
    first and second separable housing portions, said first housing portion including integrally formed members slidably interfitting with said flange means to captivate transversely said chassis within said first housing portion, said lower tab means also contacting said first housing portion to provide vertical support for said chassis;
    said second housing portion removably interlocking with said first housing portion by means of corresponding bosses and indentations and being adapted to contact said upper tab means and to captivate said chassis arrangement vertically between said first and second housing portions when joined;
    said joined housing portions further including apertures to allow electrical access to said chassis and attachment means to enable secure attachment of said electronic apparatus at a desired location.

12. The chassis captivation arrangement of claim 11 wherein said bracket means further includes attachment means at the ends of said opposite segments of said U-shape attaching a third printed circuit board to said bracket in a plane perpendicular to said parallel arrangement, said arrangement further including a third circuit board, the component side of said third printed circuit board being adjacent the component sides of said parallel pair of printed circuit boards.

* * * * *